(12) United States Patent
Minamio et al.

(10) Patent No.: US 7,915,697 B2
(45) Date of Patent: Mar. 29, 2011

(54) SENSOR DEVICE AND FABRICATION METHOD FOR THE SAME

(75) Inventors: Masanori Minamio, Osaka (JP);
Yoshihiro Tomita, Osaka (JP)

(73) Assignee: Panasonic Corporation, Osaka (JP)

( * ) Notice: Subject to any disclaimer, the term of this patent is extended or adjusted under 35 U.S.C. 154(b) by 136 days.

(21) Appl. No.: 12/404,923

(22) Filed: Mar. 16, 2009

(65) Prior Publication Data

US 2009/0242940 A1    Oct. 1, 2009

(30) Foreign Application Priority Data

Mar. 28, 2008  (JP) .................................. 2008-088470
Jan. 14, 2009  (JP) .................................. 2009-005372

(51) Int. Cl.
    *G01L 9/00* (2006.01)
(52) U.S. Cl. ................... 257/419; 257/E29.324; 438/53
(58) Field of Classification Search .................. 257/254,
    257/415, 416, 419, E29.324; 438/50, 53;
    381/114, 174, 355, 359
    See application file for complete search history.

(56) References Cited

U.S. PATENT DOCUMENTS

| 5,793,073 | A | 8/1998 | Kaminishi et al. | |
|---|---|---|---|---|
| 6,601,452 | B2 | 8/2003 | Murata et al. | |
| 6,789,431 | B2 | 9/2004 | Ishio | |
| 2007/0058826 | A1* | 3/2007 | Sawamoto et al. | 381/174 |
| 2010/0124344 | A1* | 5/2010 | Mizutani et al. | 381/190 |
| 2010/0176467 | A1* | 7/2010 | Fukasawa et al. | 257/416 |
| 2010/0189289 | A1* | 7/2010 | Takeuchi | 381/174 |

FOREIGN PATENT DOCUMENTS

| JP | 05-275530 | 10/1993 |
|---|---|---|
| JP | 09-092670 | 4/1997 |
| JP | 3295957 | 4/2002 |

* cited by examiner

*Primary Examiner* — Matthew C Landau
*Assistant Examiner* — Joseph C Nicely
(74) *Attorney, Agent, or Firm* — McDermott Will & Emery LLP

(57) ABSTRACT

The sensor device includes: a converter body made of silicon in the shape of a rhombus in plan, the converter body having an opening in the shape of a hexagon in plan; a substrate for holding the converter body; a movable film formed on the opening; a converter electrode formed on the converter body; and a substrate electrode formed on the substrate, the substrate electrode being electrically connected with the converter electrode. The opening is placed so that four of the six sides of the hexagon extend along the four sides of the rhombus of the converter body.

12 Claims, 3 Drawing Sheets

SENSOR DEVICE AND FABRICATION METHOD FOR THE SAME

CROSS-REFERENCE TO RELATED APPLICATIONS

This application claims priority under 35 U.S.C. §119 on Patent Application No. 2008-088470 filed in Japan on Mar. 28, 2008 and No. 2009-005372 filed in Japan on Jan. 14, 2009, the entire contents of which are hereby incorporated by reference.

BACKGROUND OF THE INVENTION

The present invention relates to a sensor device for detecting heat, sound, pressure and the like and a fabrication method for the same, and more particularly, to a microphone device and a fabrication method for the same.

There have been increasing demands for reduction in the size and weight of electronic equipment. In this relation, demands for size and weight reduction have also been made for sensor devices for detecting heat, sound, pressure and the like that are incorporated in electronic equipment. In particular, in portable equipment such as cellular phones, demands for reduction in the size and weight of microphones as one type of sensor devices have been made.

For the purpose of reducing the size and weight of a sensor device, a converter for detecting heat, sound, pressure and the like is mounted on a substrate to provide it as a module (see Japanese Laid-Open Patent Publication No. 9-92670, for example).

SUMMARY OF THE INVENTION

However, in the conventional sensor device described above, an existing converter is simply mounted on a substrate. No optimization for miniaturization is made for the shape of the device, the position of electrodes and the like. Hence, the sensor device fails to be sufficiently miniaturized.

The converter has a movable film formed on an opening and converts a physical displacement occurring in the movable film due to sound and the like to an electric signal. Hence, an opening for placement of the movable film is formed in a converter body made of silicon and the like. The opening is generally circular or rectangular in plan. Etching is generally used for formation of the opening. In etching of the converter body, however, side etching occurs in which the upper part of the opening widely expands horizontally compared with the lower part thereof. It is therefore necessary to increase the size of the converter body considering this expansion of the opening. As a result, the occupation area of the sensor device increases.

The converter and the substrate are connected with each other via bonding wires and the like. Hence, a converter electrode must be formed for the converter and a substrate electrode for the substrate. For this, space for forming the converter electrode must be secured in the surroundings of the opening, and this causes increase in the size of the converter. Also, a region for forming the substrate electrode must be secured on the substrate, causing formation of dead space.

An object of the present disclosure is providing a sensor device efficiently miniaturized by reducing dead space occurring in a converter and a substrate.

According to the present disclosure, the sensor device includes a converter body that is in the shape of a rhombus in plan and has an opening in the shape of a hexagon in plan.

Specifically, the sensor device of the present disclosure includes: a converter body made of silicon in the shape of a rhombus in plan, the converter body having an opening in the shape of a hexagon in plan; a substrate for holding the converter body; a movable film formed on the opening; a converter electrode formed on the converter body; and a substrate electrode formed on the substrate, the substrate electrode being electrically connected with the converter electrode, wherein the opening is placed so that four of the six sides of the hexagon extend along the four sides of the rhombus of the converter body.

The sensor device of the present disclosure is less likely to cause a phenomenon that the opening widely expands horizontally during etching. Hence, since the size of the converter body can be minimized, the sensor device can be easily miniaturized.

BRIEF DESCRIPTION OF THE DRAWINGS

FIGS. 1A to 1C show a sensor device of an embodiment of the present invention, in which FIG. 1A is a plan view, FIG. 1B is a cross-sectional view taken along line Ib-Ib in FIG. 1A, and FIG. 1C is a cross-sectional view taken along line Ic-Ic in FIG. 1A.

FIGS. 2A and 2B are views for comparison of the sensor device of the embodiment of the present invention with a conventional sensor device, in which FIG. 2A is a plan view of the sensor device of the embodiment and FIG. 2B is a plan view of the conventional sensor device.

DESCRIPTION OF THE PREFERRED EMBODIMENTS

The sensor device of the present disclosure may be of any type of sensor device that has a movable film and has a mechanism of detecting a physical fluctuation occurring in the movable film. Hereinafter, however, description will be made taking a microphone device as an example.

Figure 1A:
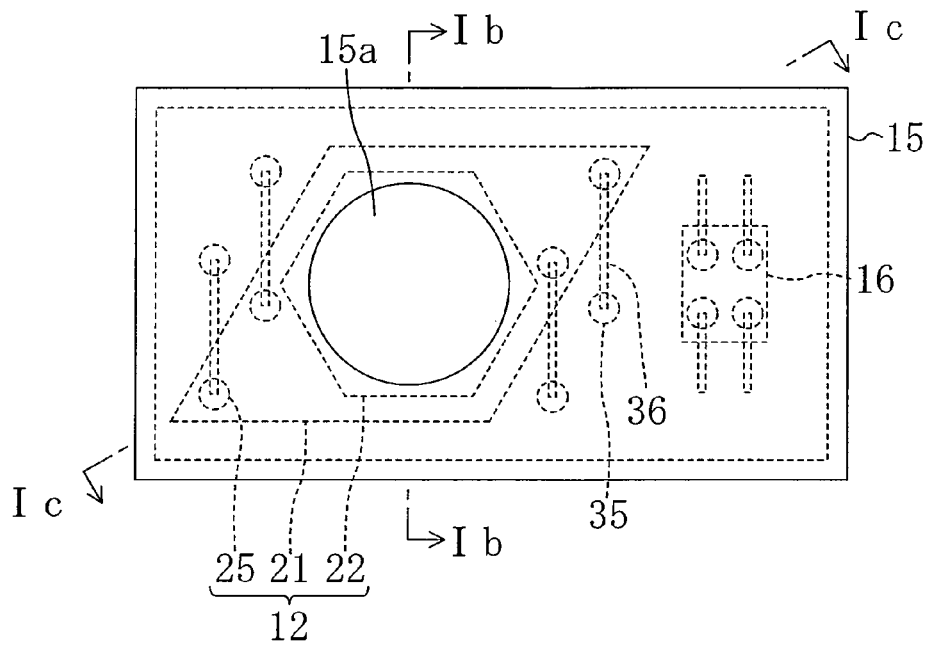
Figure 1B:
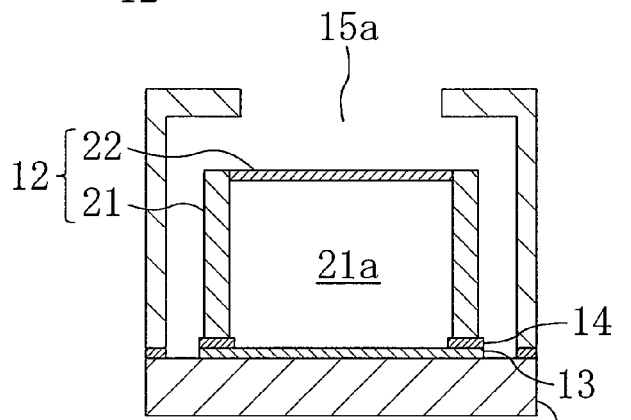
Figure 1C:
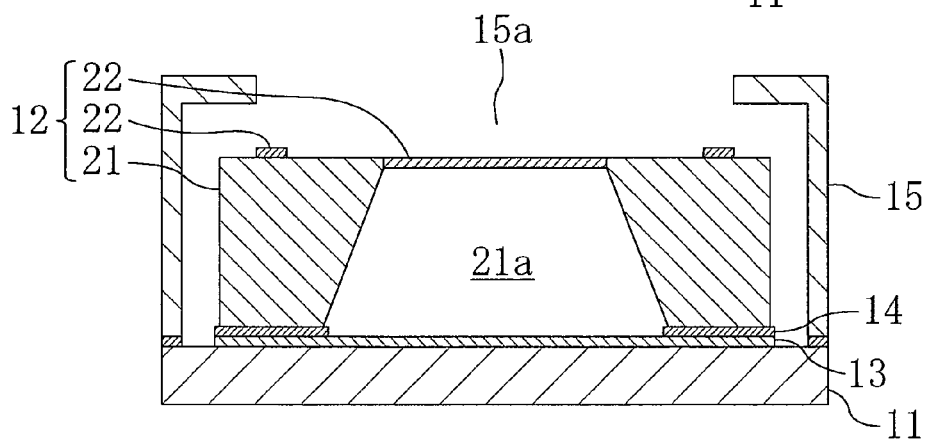

FIGS. 1A to 1C show a microphone device of an embodiment, in which FIG. 1A is a plan view, FIG. 1B is a cross-sectional view taken along line Ib-Ib in FIG. 1A, and FIG. 1C is a cross-sectional view taken along line Ic-Ic in FIG. 1A. As shown in FIGS. 1A to 1C, the microphone device of this embodiment has a converter 12 held on a substrate 11 with a bonding pad 13 and an adhesive 14 interposed therebetween. A signal processing element 16, or specifically an amplifier element, is mounted on the substrate 11. An electric signal outputted from the converter 12 is amplified by the signal processing element 16 and then outputted from the microphone device. The converter 12 and the signal processing element 16 are sheathed with a cover 15 having a sound hole 15a.

The converter 12 has a converter body 21 made of a silicon plate whose shape is rhombus in plan and whose top and bottom plane orientation is (011). The converter body 21 has an opening 21a whose shape is hexagonal in plan. A movable film 22 is formed on the top of the opening 21a. The movable film 22 vibrates with sound that has entered through the sound hole 15a, and this vibration is converted to an electric signal. The converted electric signal is outputted via converter electrodes 25 formed on the converter body 21. The signal outputted via the converter electrodes 25 is inputted into the signal processing element 16 via bonding wires 36 and substrate electrodes 35 formed on the substrate 11.

As shown in FIG. 1A, the converter body 21 is in the shape of a rhombus having an obtuse angle of approximately 127 degrees and an acute angle of approximately 53 degrees. The opening 21a is in the shape of a hexagon and placed so that four out of the six sides of the hexagon extend along the four sides of the rhombus of the converter body 21. With this placement, the microphone device can be efficiently miniaturized for the reason described below.

Figure 2A:
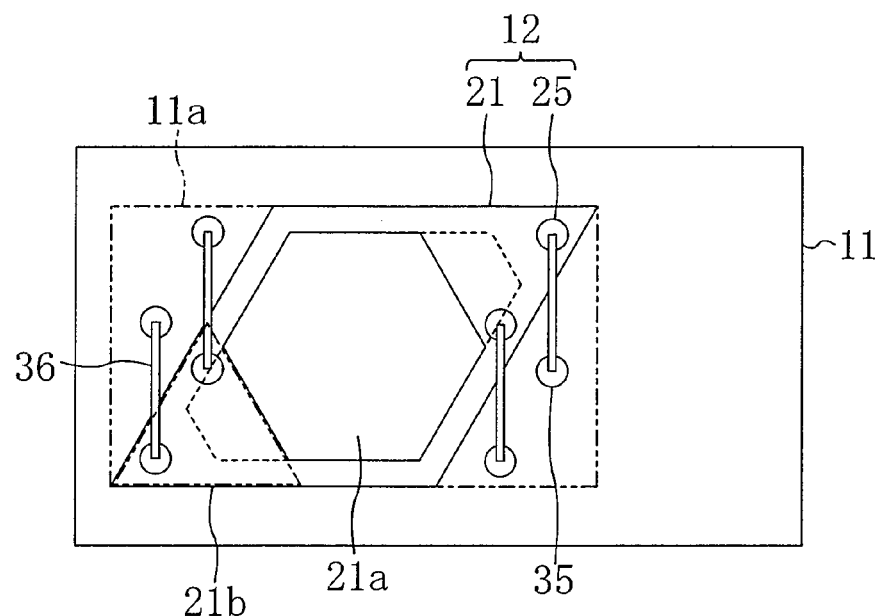
Figure 2B:
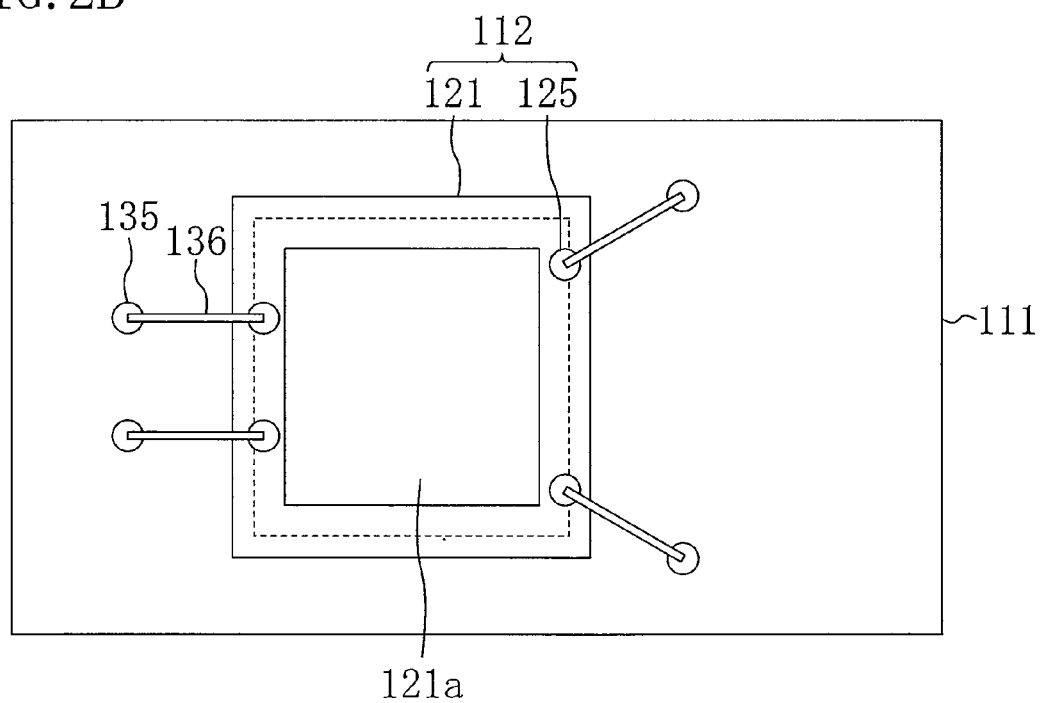

FIGS. 2A and 2B respectively show the microphone device of this embodiment and a conventional microphone device, presented to compare the sizes thereof when they are formed so that the opening 21a and an opening 121a have roughly the same area. Note that the movable film, the cover and the signal processing element are omitted in FIGS. 2A and 2B.

The converter body 21 of this embodiment has crystal plane orientation (011) on its top and bottom faces. Hence, when the opening 21a in the shape of a hexagon having a vertex angle of approximately 127 degrees correspondingly to the obtuse vertices of the converter body 21 is formed by anisotropic wet etching, walls of the opening 21a that are in parallel with the corresponding sides of the converter body 21 become almost vertical, since they have crystal plane orientation (111) as shown in FIG. 1B. It is therefore unnecessary to provide space for expansion of the opening 21a due to etching in the surroundings of the opening 21a. Walls of the opening 21a that oppose the acute vertices of the converter body 21 are inclined in a tapered shape as shown in FIG. 1C. This however arises no problem because there is large space prepared on the sides closer to the acute vertices.

On the contrary, in the conventional microphone device shown in FIG. 2B, in which a square opening 121a is formed in a square converter body 121, the walls of the opening 121a are inclined in a tapered shape by side etching. It is therefore necessary to provide space for expansion of the opening 121a due to etching in the surroundings of the opening 121a.

The converter 12 in this embodiment has the converter electrodes 25 formed on triangular regions (converter electrode formation regions) 21b located between the acute vertices of the converter body 21 and the opening 21a. Hence, the dead space of the converter body 21 can be minimized. On the contrary, in the conventional converter 112 that is square in plan, large dead space occurs for formation of converter electrodes 125.

Also, in the microphone device of this embodiment, the substrate electrodes 35 are formed on portions (substrate electrode formation regions) 11a of a rectangular region whose opposite vertices are the two acute vertices of the converter body 12 excluding the portion on which the converter 12 is placed. Hence, the dead space of the substrate 11 can also be minimized. In interconnection between the two types of electrodes via a bonding wire, a sliding distance is required. It is therefore necessary to secure a distance between the two electrodes of at least 0.5 mm. For this reason, in the case of using the square converter 112 as shown in FIG. 2B, large dead space is necessary outside the converter 112 to secure the distance between the converter electrodes 125 and substrate electrodes 135. In this embodiment, however, using the rhombus-shaped converter 12, large dead space does not occur even though the distance is secured between the converter electrodes 25 and the substrate electrodes 35 as shown in FIG. 2A.

As described above, the microphone device of this embodiment is less likely to have dead space compared with the conventional microphone device and thus can be efficiently miniaturized.

Figure 3:
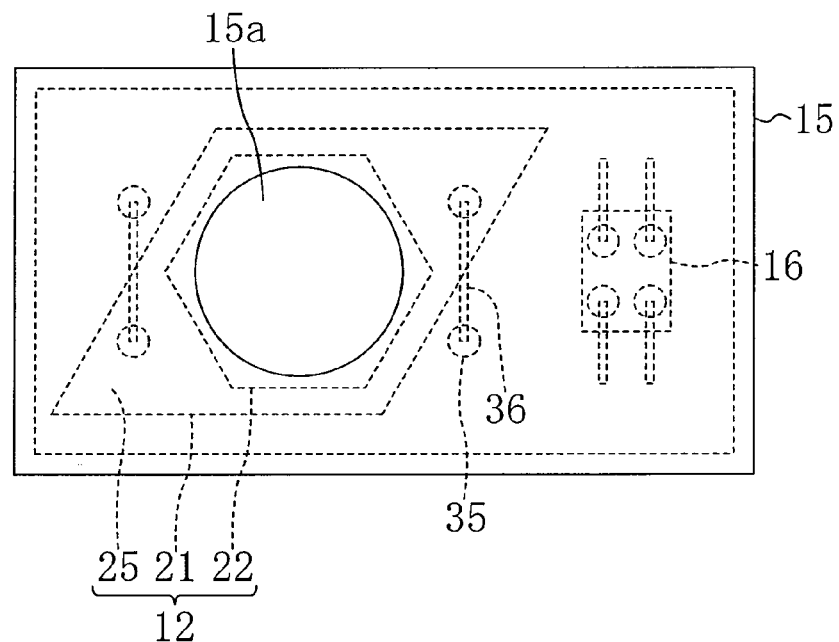
FIG. 3 is a plan view of an alteration of the sensor device of the embodiment of the present invention.

In this embodiment, shown was an example in which each two bonding wires 36 for connecting the converter 12 with the signal processing element 16 on the substrate 11 were formed on the right and left sides of the converter 12. The number of bonding wires is not limited to this as long as exchange of a signal between the converter 12 and the signal processing element 16 is secured. For example, each one bonding wire may be formed as shown in FIG. 3. Alternatively, the converter 12 and the signal processing element 16 may be electrically connected in another way, not using the bonding wires 36.

Figure 4:
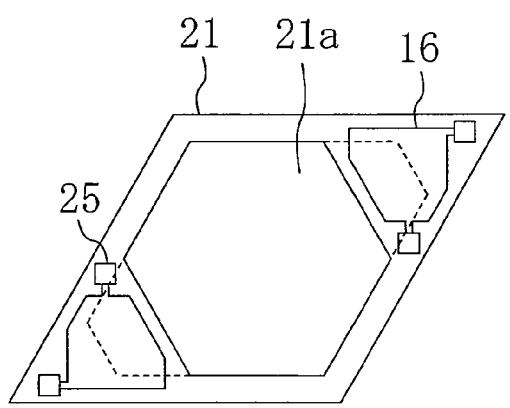
FIG. 4 is a plan view of an alteration of a converter of the sensor device of the embodiment of the present invention.

Although the signal processing element 16 was formed on the substrate 11 as shown in FIG. 1A, it may be formed on the converter body 21. In this case, as shown in FIG. 4, the signal processing element 16 may be formed on the triangular regions between the acute vertices of the converter body 21 and the opening 21a. With this placement, the dead space of the converter body 2 can be further reduced, and hence the microphone device can be further miniaturized.

In this embodiment, the converter body 21 was described as being in the shape of a rhombus in plan having an obtuse angle of approximately 127 degrees and an acute angle of approximately 53 degrees and the opening 21a as being in the shape of a hexagon on the top face. Although the microphone device can be miniaturized most efficiently with this configuration, the configuration is not limited to this. It is only essential to place the opening 21a so that four out of the six sides of the hexagon extend along the four sides of the rhombus of the converter body 21.

In this embodiment, the sensor device was described as a microphone device. This embodiment can also be applied to any sensor as long as it detects a physical displacement of a movable film formed on an opening. For example, substantially the same effect can be obtained for a thermal sensor, a pressure sensor, a vibration sensor and the like.

In this embodiment, an amplifier element was placed as the signal processing element 16. Substantially the same effect can also be obtained for any type of signal processing element required for signal processing of the sensor device, such as an analog-digital conversion circuit, a temperature characteristic compensation circuit and the like, for example.

In this embodiment, shown was an example of forming the hexagonal opening by wet etching low in fabrication cost. The hexagonal opening may otherwise be formed by deep dry etching. By adopting deep dry etching, the six walls of the hexagonal opening can be made roughly vertical. When the opening 121a of the conventional square sensor device is formed with its four walls being roughly vertical by deep dry etching, for example, it is difficult to provide a sufficient region in the surroundings of the opening 121a. In the configuration of the present invention, however, the triangular regions can be secured between the acute vertices of the rhombus of the converter body 21 and the hexagonal opening 21a also in the case of adopting deep dry etching. Hence, substantially the same effect as that described above can be obtained.

As described above, according to the present disclosure, an efficiently miniaturized sensor device can be implemented by reducing dead space occurring in the converter and the substrate. Hence, the sensor device and the fabrication method for the same of the present disclosure are useful as various sensor devices, in particular a microphone device and the fabrication method for the same.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A sensor device comprising:
    a converter body made of silicon in the shape of a rhombus in plan view, the converter body having an opening in the shape of a hexagon in plan view;
    a substrate for holding the converter body;
    a movable film formed on the opening;
    a converter electrode formed on the converter body; and
    a substrate electrode formed on the substrate, the substrate electrode being electrically connected with the converter electrode,
    wherein the opening is placed so that four of the six sides of the hexagon extend along the four sides of the rhombus of the converter body.

2. The sensor device of claim 1, wherein the crystal plane orientation on the top and bottom faces of the converter body is (011).

3. The sensor device of claim 1, wherein the converter body is in the shape of a rhombus having obtuse vertices of approximately 127 degrees, and
    the shape of the opening on the top of the converter body is a hexagon having vertices corresponding to the obtuse vertices which are approximately 127 degrees.

4. The sensor device of claim 1, wherein the converter electrode is formed on a triangular region located between an acute vertex of the converter body and the opening.

5. The sensor device of claim 4, further comprising a signal processing element formed on the triangular region of the converter body.

6. The sensor device of claim 1, further comprising a signal processing element formed on the substrate.

7. The sensor device of claim 1, wherein the substrate electrode is formed on a portion of a rectangular region whose opposite vertices are the two acute vertices of the converter body on the substrate excluding the portion occupied by the converter body.

8. The sensor device of claim 1, wherein the converter electrode and the substrate electrode are electrically connected with each other via a bonding wire.

9. The sensor device of claim 1, wherein at least one pair out of three pairs of inner walls of the opening facing each other are roughly vertical, and at least one pair out of the remaining two pairs are inclined.

10. The sensor device of claim 9, wherein two pairs out of the three pairs of inner walls are roughly vertical.

11. The sensor device of claim 9, wherein the inclined inner walls oppose the acute vertices of the converter body.

12. A fabrication method for a sensor device, comprising the steps of:
    preparing a silicon plate in the shape of a rhombus in plan view whose crystal plane orientation on the top and bottom faces is (011);
    forming an opening in the shape of a hexagon in plan view where four sides extend along the four sides of the rhombus of the silicon plate by selectively etching the silicon plate;
    forming a movable film on the opening; and
    holding the silicon plate on a substrate.

* * * * *